US012658263B2

(12) United States Patent (10) Patent No.: US 12,658,263 B2
Lee et al. (45) Date of Patent: Jun. 16, 2026

(54) STORAGE DEVICES WITH REGION-DEPENDENT INITIAL PROGRAM VOLTAGES

(71) Applicant: Samsung Electronics Co., Ltd., Suwon-si (KR)

(72) Inventors: Seunghan Lee, Suwon-si (KR); Bumjun Kim, Suwon-si (KR); Bodon Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 252 days.

(21) Appl. No.: 18/320,409

(22) Filed: May 19, 2023

(65) Prior Publication Data

US 2024/0145012 A1 May 2, 2024

(30) Foreign Application Priority Data

Oct. 28, 2022 (KR) ......................... 10-2022-0141512

(51) Int. Cl.
*G11C 16/12* (2006.01)
*G11C 16/04* (2006.01)
*G11C 16/30* (2006.01)

(52) U.S. Cl.
CPC .......... *G11C 16/12* (2013.01); *G11C 16/0433* (2013.01); *G11C 16/30* (2013.01)

(58) Field of Classification Search
CPC ..... G11C 16/12; G11C 16/0433; G11C 16/30; G11C 16/20; G11C 16/0483; G11C 16/32; G11C 16/08; G11C 16/10; G11C 5/145; G06F 3/0658
See application file for complete search history.

(56) References Cited

U.S. PATENT DOCUMENTS

| | | | |
|---|---|---|---|
| 9,052,892 B2 | 6/2015 | Ristic et al. | |
| 9,390,803 B2 | 7/2016 | Shim et al. | |
| 10,453,541 B1 | 10/2019 | Rowley et al. | |
| 10,754,413 B2 | 8/2020 | Bibikar et al. | |
| 10,803,963 B2 | 10/2020 | Rowley et al. | |
| 10,818,352 B2 | 10/2020 | Lee et al. | |
| 11,016,545 B2 | 5/2021 | Yang et al. | |
| 11,264,833 B2 | 3/2022 | Warren et al. | |

(Continued)

FOREIGN PATENT DOCUMENTS

KR          102338133 B1    12/2021

OTHER PUBLICATIONS

"Extended European Search Report for European Application No. 23181754.5, dated Mar. 15, 2024, 9 pages".

(Continued)

*Primary Examiner* — Amir Zarabian
*Assistant Examiner* — Bradley S Coon
(74) *Attorney, Agent, or Firm* — Wolf, Greenfield & Sacks, P.C.

(57) ABSTRACT

A memory device of a storage device includes a memory cell array divided into a plurality of regions including a first region and a second region. The device controller is configured to control the storage device so as to allow the memory device to program first data into the first region using a first initial program voltage, and to program second data into the second region using a second initial program voltage having a different magnitude from the first initial program voltage.

19 Claims, 11 Drawing Sheets

(56) References Cited

U.S. PATENT DOCUMENTS

| | | | |
|---|---|---|---|
| 11,397,460 | B2 | 7/2022 | Yang et al. |
| 11,404,906 | B1 | 8/2022 | Wang et al. |
| 2015/0380093 | A1* | 12/2015 | Shim .................. G11C 16/3459 |
| | | | 365/185.11 |
| 2019/0280600 | A1 | 9/2019 | Rowley |
| 2019/0348127 | A1* | 11/2019 | Chin ...................... G11C 16/08 |
| 2019/0371414 | A1* | 12/2019 | Nguyen ................. G11C 16/08 |
| 2020/0075108 | A1 | 3/2020 | Rowley et al. |
| 2020/0098427 | A1* | 3/2020 | Lee ................... G11C 13/0028 |
| 2020/0243141 | A1 | 7/2020 | Lu et al. |
| 2020/0312765 | A1 | 10/2020 | Kawasaki et al. |
| 2020/0350017 | A1* | 11/2020 | Lee ........................ G11C 16/08 |

OTHER PUBLICATIONS

"Extended European Search Report dated Jan. 24, 2024, issued in corresponding European Application No. 23194734.2, 7 pages".

* cited by examiner

<u>100</u>

1200

STORAGE DEVICES WITH REGION-DEPENDENT INITIAL PROGRAM VOLTAGES

CROSS-REFERENCE TO RELATED APPLICATION

This application claims priority to and the benefit of Korean Patent Application No. 10-2022-0141512, filed in the Korean Intellectual Property Office on Oct. 28, 2022, and the entire contents of the above-identified application are incorporated by reference herein.

BACKGROUND

(a) Field

The disclosure relates to storage devices and operating methods thereof.

(b) Description of the Related Art

Storage devices are being continuously developed with larger capacities. For example, one approach is using a stacked structure in NAND flash memories, while another approach is increasing a cell bit density. Both approaches aim to increase the overall capacity of the device. When increasing the capacity of the storage device, performance may not be consistent across all regions of memory due to variations in the manufacturing process. This may result in differences in program execution times depending on the regions of memory.

SUMMARY

Some embodiments may provide storage devices and operation methods thereof that may improve and/or maintain performance consistency.

According to some embodiments, a storage device may include a memory device and a device controller. The memory device may include a memory cell array divided into a plurality of regions including a first region and a second region. The device controller may control the storage device such that the memory device programs first data into the first region using a first initial program voltage, and programs second data into the second region using a second initial program voltage having a different magnitude from the first initial program voltage.

According to some embodiments, a storage device may include a power management device, a device controller, a voltage divider, a switching circuit, and a memory cell array. The power management device may be configured to supply a first initial program voltage, and the device controller may be configured to output a control signal. The voltage divider may divide the first initial program voltage to generate one or more second initial program voltages. The switching circuit may be configured to select a selected initial program voltage from among a plurality of initial program voltages including the first initial program voltage and the one or more second initial program voltages in response to the control signal. The memory cell array may program data using the selected initial program voltage selected by the switching circuit.

According to some embodiments, a storage device may include a plurality of voltage supply lines, a device controller, a switching circuit, and a memory cell array. The plurality of voltage supply lines may be configured to transfer respectively a plurality of initial program voltages including a first initial program voltage and a second initial program voltages that have different magnitudes, and the device controller may output a control signal. The switching circuit may select a selected initial program voltage from among the plurality of initial program voltages transferred through the plurality of voltage supply lines in response to the control signal. The memory cell array may program data using the initial program voltage selected by the switching circuit.

DETAILED DESCRIPTION OF THE EMBODIMENTS

Figure 1:
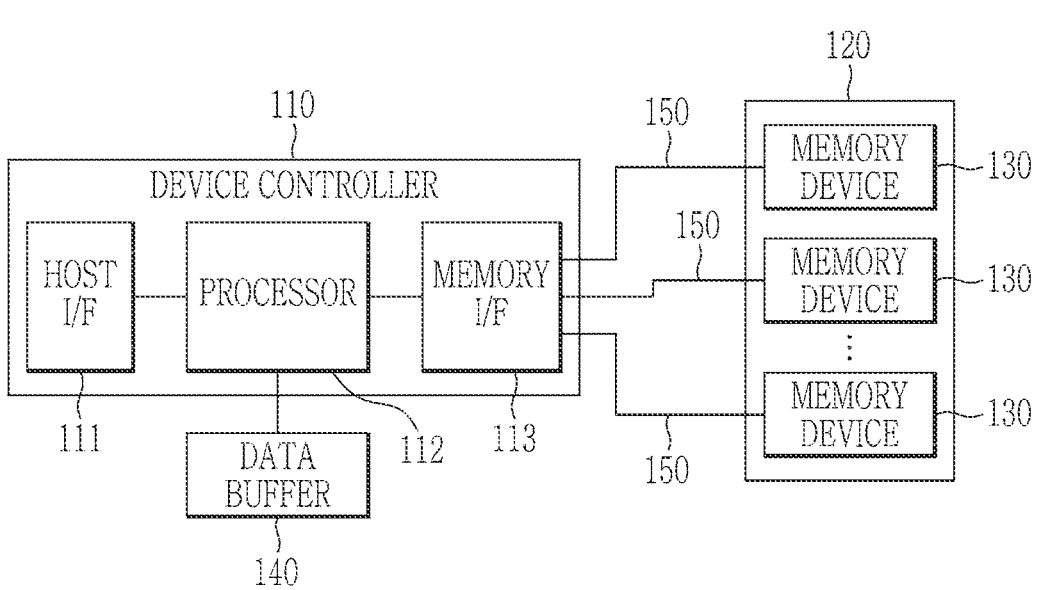
FIG. 1 is a diagram illustrating an example of a storage device according to some embodiments.

In the following detailed description, only certain embodiments of the present inventive concepts have been shown and described, simply by way of illustration. As those skilled in the art would realize, the described embodiments may be modified in various different ways, all without departing from the spirit or scope of the present inventive concepts.

Accordingly, the drawings and description are to be regarded as illustrative in nature and not restrictive. Like reference numerals designate like elements throughout the specification. The sequence of operations or steps is not limited to the order presented in the claims or figures unless specifically indicated otherwise. The order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are only used to distinguish one element, component, step or operation from another element, component, step, or operation.

Figure 2:
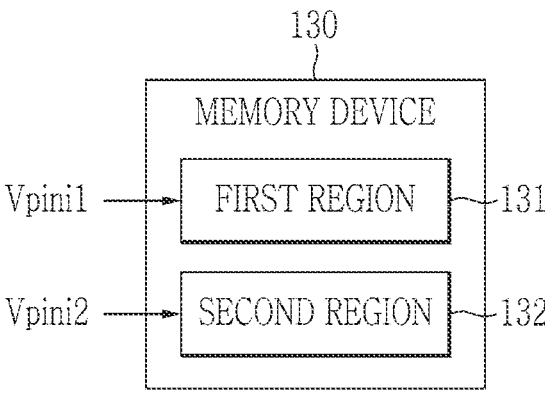
FIG. 2 is a diagram illustrating an example of a memory device in a storage device according to some embodiments.

FIG. 1 is a diagram illustrating an example of a storage device according to some embodiments, and FIG. 2 is a diagram illustrating an example of a memory device in a storage device according to some embodiments.

Referring to FIG. 1, a storage device 100 may include a device controller 110 and a non-volatile memory 120.

The device controller 110 may control a memory operation of the non-volatile memory 120 by providing a signal to the non-volatile memory 120. The signal may include a command and/or data. The command may include a command type, such as read or write, and an address. The device controller 110 may read data from the non-volatile memory 120 by providing a read command to the non-volatile memory 120. Further, the device controller 110 may program data in the non-volatile memory 120 by providing a write command and the data to the non-volatile memory 120. In some embodiments, the device controller 110 may provide an erase command to the non-volatile memory 120 to erase data stored in the non-volatile memory 120.

The non-volatile memory 120 may include a memory device 130. In some embodiments, the non-volatile memory 120 may include a plurality of memory devices 130. The memory device 130 may be a memory package, and the memory package may include a memory chip or a memory die. In some embodiments, the memory device 130 may be a flash memory device, such as a NAND flash-based memory device. In some other embodiments, the memory device 130 may be another non-volatile memory-based device. The other non-volatile memory may include, for example, a phase-change memory, a resistive memory, a magnetoresistive memory, a ferroelectric memory, or a polymer memory. The memory device 130 may be connected to the device controller 110 through a channel 150.

Referring to FIG. 2, the memory device 130 may be divided into a plurality of regions 131 and 132. Although FIG. 2 shows two regions 131 and 132 for convenience, the number of regions 131 and 132 is not limited thereto. In some embodiments, the plurality of regions 131 and 132 may be divided based on program time (e.g., a time to perform a program or write operation). For example, a target program voltage of the region 131 may be higher than a target program voltage of the region 132, such that a program time required to reach the target program voltage in the region 131 may be longer than a program time required to reach the target program voltage in the region 132. For example, when an incremental step pulse programming (ISPP) method is used, the number of ISPPs performed to reach the target program voltage in the region 131 is more than the number of ISPPs performed to reach the target program voltage in the region 132. Accordingly, the device controller 110 may set an initial program voltage Vpini1 used for the region 131 to be higher than an initial program voltage Vpini2 used for the region 132. Since the initial program voltage Vpini1 of the region 131 is relatively higher, the program time (e.g., the number of ISPPs) required to reach the target program voltage in the region 131 may be reduced. Accordingly, the program time required to reach the target program voltage in the region 131 may be set to be similar to the program time required to reach the target program voltage in the region 132.

In some embodiments, the division of the plurality of regions 131 and 132 may be preset in the device controller 110. For example, the plurality of regions 131 and 132 may be pre-divided based on variations in the manufacturing process.

Referring to FIG. 1 again, in some embodiments, the device controller 110 may include a host interface 111, a processor 112, and a memory interface 113.

The host interface 111 may receive a command from a host (not shown). Further, the host interface 111 may exchange data with the host. The memory interface 113 may transfer a control signal and a physical address to the non-volatile memory 120 and exchange data with the non-volatile memory 120.

The processor 112 may control the overall operation of the device controller 110. The processor 112 may receive the command from the host through the host interface 111 and parse the command to obtain a command type and a logical address. When the command type indicates write (i.e., a write command), the processor 112 may obtain target data from the host through the host interface 111. The processor 112 may convert the logical address into a physical address pointing to an address in the non-volatile memory 120. In some embodiments, the storage device 100 may further include a data buffer 140 that temporarily stores target data to be programmed into the non-volatile memory 120.

The processor 112 may identify a location to which target data is to be programmed in the non-volatile memory 120 based on the physical address. In some embodiments, the processor 112 may determine a memory device 130 on which target data is to be programmed among the memory devices 130, and the location (target location) in the memory device 130 where the target data is to be programmed. The processor 112 may determine a region to which the target location belongs among the regions 131 and 132, and may control the storage device to use an initial program voltage corresponding to the determined region when programming the target data in the memory device 130. Different initial program voltages Vpini1 and Vpini2 may correspond to the regions 131 and 132, respectively. In some embodiments, the initial program voltage Vpini1 corresponding to the region 131 with a long program time may be higher than the initial program voltage Vpini2 corresponding to the region 132 with a short program time.

As described above, since the storage device 100 may program the target data using the relatively high initial program voltage in the region 131 having the relatively long program time, the program time of the region 131 having the relatively long program time may be reduced. Accordingly, the program time consistency in the non-volatile memory 120 may be maintained.

Figure 3:
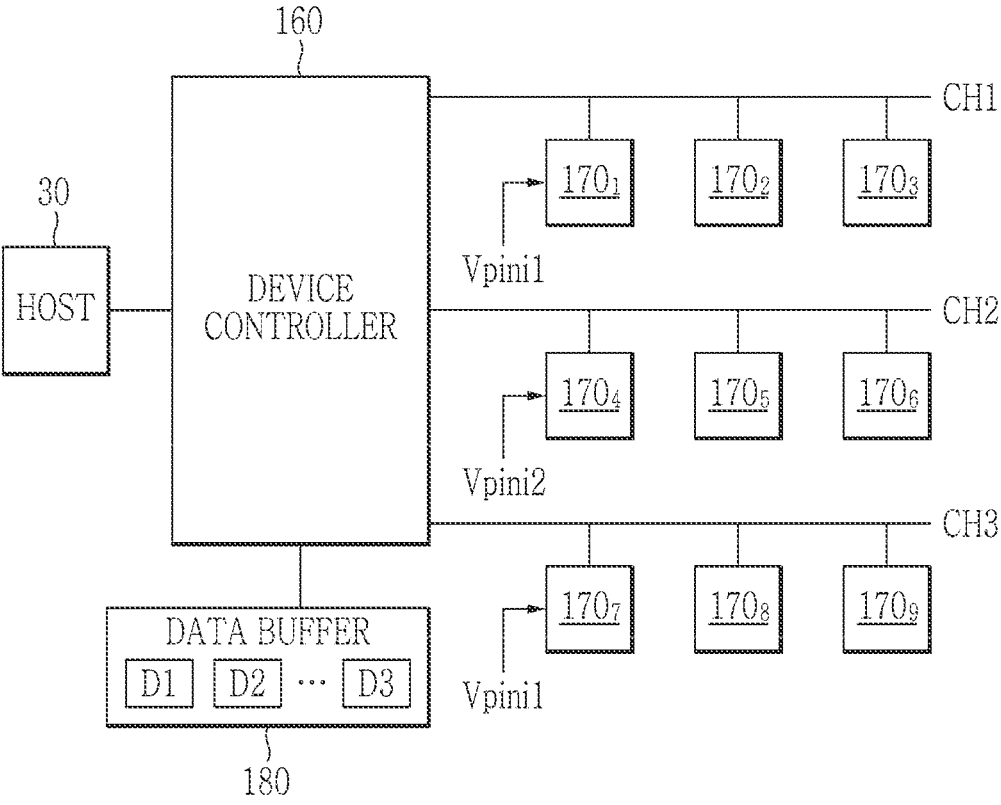
FIG. 3 is a diagram illustrating an example of program in a storage device according to some embodiments.

FIG. 3 is a diagram illustrating an example of program in a storage device according to some embodiments.

Referring to FIG. 3, a device controller 160 may store data received from a host 30 in a data buffer 180 in units of a predetermined size. In some embodiments, the predetermined size may be a page. A plurality of memory devices 1701, 1702, 1703, 1704, 1705, 1706, 1707, 1708, and 1709 may be connected to the device controller 160 through channels CH1, CH2, and CH3. In some embodiments, a plurality of memory devices may be connected to one channel. Although FIG. 3 shows the three channels CH1, CH2, and CH3 for convenience, the number of channels CH1, CH2, and CH3 is not limited thereto. Further, although FIG. 3 shows that three memory devices are connected to one channel for convenience, the number of memory devices connected to a channel is not limited thereto.

The device controller 160 may convert a logical address corresponding to each unit of data into a physical address, and identify a target memory device 1701 among the memory devices 1701 to 1709 based on the physical address of the corresponding data and a storage region that the data is to be programmed into. Here, i is an integer between 1 and 9. The device controller 160 may determine an initial program voltage of the target memory device 1701 based on a location of the identified storage region.

For example, when data D1 is to be programmed in a first region (e.g., 131 in FIG. 2) of the memory device 1701, data D2 is to be programmed in a second region (e.g., 133 in FIG. 2) of the memory device 1704, and data D3 is to be programmed in the first region 131 of the memory device 1707, the device controller 160 may set initial program voltages of the memory devices 1701 and 1707 to the first initial program voltage Vpini1, and an initial program voltage of the memory device 1704 to the second initial program voltage Vpini2. In this case, the first region 131 is a region having a longer program time than the second region 132, and the first initial program voltage Vpini1 may be higher than the second initial program voltage Vpini2. Accordingly, when the data D1, D2, and D3 are programmed into the memory devices 1701, 1704, and 1707, voltages of selected word lines in the memory devices 1701 and 1707 may increase from the first initial program voltage Vpini1 to the target program voltage, and a voltage of a selected word line in the memory device 1704 may increase from the second initial program voltage Vpini2 to the target program voltage. Accordingly, the program time may be constant regardless of the regions in the memory devices 1701, 1704, and 1707.

Next, an example of classifying regions in a memory device based on variations in a manufacturing process is described with reference to FIG. 4 and FIG. 5.

Figure 4:
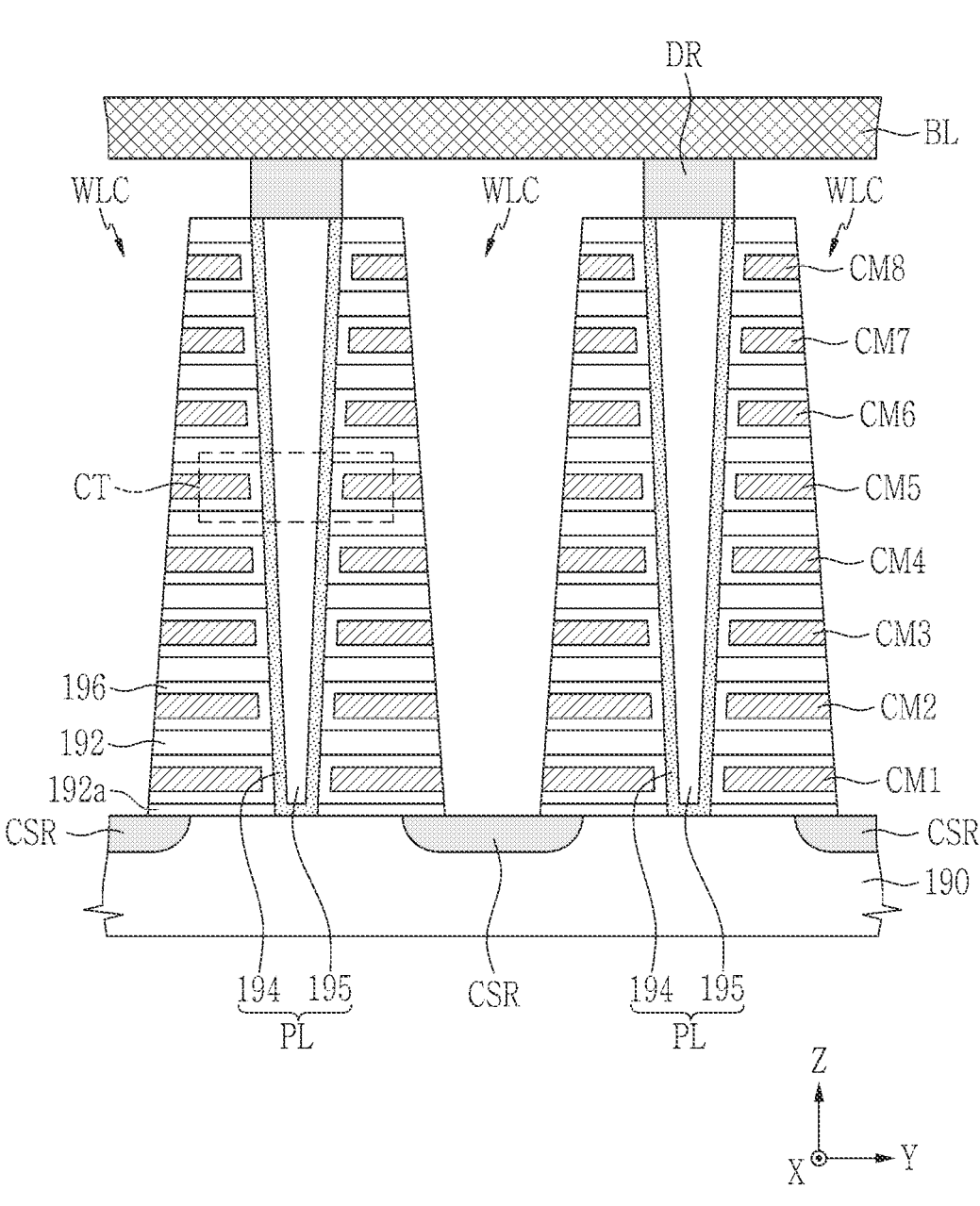
FIG. 4 is a diagram illustrating an example of a memory device according to some embodiments.
Figure 5:
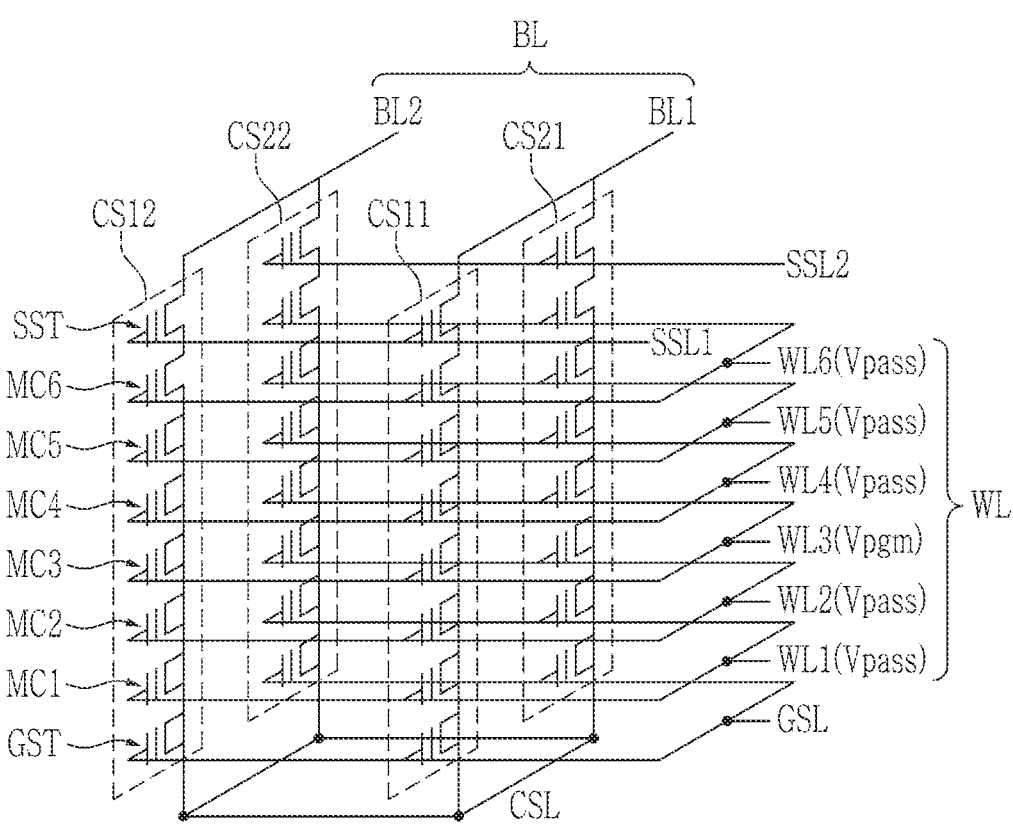
FIG. 5 is a diagram illustrating an example of an equivalent circuit of a memory device illustrated in FIG. 4.

FIG. 4 is a diagram illustrating an example of a memory device according to some embodiments, and FIG. 5 is a diagram illustrating an example of an equivalent circuit of a memory device illustrated in FIG. 4. Although FIG. 4 and FIG. 5 show an example of a vertical NAND flash memory device for convenience, the memory device is not limited thereto.

Referring to FIG. 4, in a memory cell array having a vertical structure in a memory device 400, a plurality of common source regions CSR extending in length in a first direction (e.g., X-axis direction) may be provided on a substrate 190, and may be spaced apart from one another along a second direction (e.g., Y-axis direction). The common source regions CSR may be connected in common to form a common source line.

Between two adjacent common source regions CSR, a plurality of insulation materials 192 and 192a may be provided sequentially on the substrate 190 along a third direction (e.g., Z-axis direction). The insulation materials 192 and 192a may be spaced apart along the third direction, and may extend in the first direction. The insulation materials 192 and 192a may include, for example, an insulation material such as a semiconductor oxide film.

Between two adjacent common source regions CSR, a plurality of pillars PL may be arranged sequentially along the second direction so as to penetrate or extend through the plurality insulation materials 192 and 192a along the third direction. The pillars PL may contact the substrate 190 though the insulation materials 192 and 192a. Each pillar PL may include a plurality of materials. For example, the pillar PL may include a channel film 194 and an internal material 195 provided within the channel film 194. The channel film 194 may include a semiconductor material (e.g., silicon), and the internal material 195 may include an insulation material.

Between two adjacent common source regions CSR, information storage films 196 may be provided on exposed surfaces of the insulation materials 192 and 192a and the pillar PL. The information storage film 196 may store information by trapping or discharging charges.

Between the insulation materials 192 and 192a, conductive materials CM1, CM2, CM3, CM4, CM5, CM6, CM7, and CM8 may be provided on exposed surfaces of the information storage films 196. The conductive materials CM1 to CM8 may extend in the first direction. The conductive materials CM1 to CM8 on the common source regions CSR may be separated by word line cuts WLC, and the word line cuts WLC may expose the common source regions CSR. The conductive materials CM1 to CM8 may include, for example, a metallic conductive material or a non-metallic conductive material such as polysilicon.

A plurality of drains DR may be provided on the pillars PL. Bit lines BL extending in the second direction may be provided on the drains DR so as to be spaced apart from one another along the first direction. The bit lines BL may be connected to the drains DR. The bit lines BL may include a metallic conductive material or a non-metallic conductive material such as polysilicon.

The pillars PL may form a plurality of cell strings together with the information storage films 196 and the conductive materials CM1 to CM8. Each pillar PL may form a cell string together with the information storage films 196 and adjacent conductive materials CM1 to CM8. Each cell string may include a plurality of cell transistors CT stacked in a direction perpendicular to the substrate 190.

Referring to FIG. 5, cell strings CS11, CS12, CS21, and CS22 may be provided between the bit lines BL1 and BL2 (BL) and the common source line CSL. The cell strings CS11 and CS21 may be connected between the bit line BL1 and the common source line CSL, and the cell strings CS12 and CS22 may be connected between the bit line BL2 and the common source line CSL. Each of the cell strings CS11, CS12, CS21, and CS22 may correspond to a pillar PL shown in FIG. 4.

Referring to FIG. 4 and FIG. 5, the conductive material CM1 may form ground selection transistors GST together with the information storage films 196 and the pillars PL. Further, the conductive material CM1 may form the ground select line GSL. The conductive materials CM2 to CM7 may form memory cells MC1 to MC6 together with the information storage films 196 and the pillars PL. Further, the conductive materials CM2 to CM7 may form word lines WL1, WL2, WL3, WL4, WL5, and WL6 (WL), respectively. The memory cells having the same height may be commonly connected to a word line WL. The conductive material CM8 may form string selection transistors SST together with the information storage films 196 and the pillars PL. Further, the conductive material CM8 may form the string selection lines SSL1 and SSL2.

In this structure, when programming memory cells (e.g., MC3) are positioned at a certain height, a program voltage Vpgm may be applied to the word lines (e.g., WL3) of the memory cells MC3, and a pass voltage Vpass may be applied to the word lines WL1, WL2, WL4, WL5, and WL6 of the other memory cells MC1, MC2, MC4, MC5, and MC6. The program voltage Vpgm may be, for example, a voltage that causes tunneling in the memory cell, and the pass voltage Vpass may be a voltage that forms a channel in the memory cell.

As shown in FIG. 4 and FIG. 5, the word lines WL and the information storage films 196 may be penetrated by the pillars PL and the word line cuts WLC, and the pillars PL and the word line cuts WLC may have widths that become narrower as they approach an upper surface of the substrate 190. In such a vertical structure, the cell transistor CT (i.e., the memory cell) may have a better program or programming characteristic as a distance from the upper surface of the substrate 190 increases. That is, memory cells may have a lower target program voltage as the distance from the upper surface of the substrate 190 increases. Therefore, a program time for the memory cell MC6 located on an upper layer may be shorter when using the same initial program voltage Vpini, when compared to the memory cell MC1 located on a lower layer, relative to the upper surface of the substrate 190. Accordingly, the memory cells (e.g., MC1 to MC4) connected to the word lines (e.g., WL1 to WL4) located lower than a predetermined height on the substrate 190 may be set to the first region 131 shown in FIG. 2, and the memory cells (e.g., MC5 and MC6) connected to the word lines (e.g., WL5 and WL6) located higher than the predetermined height may be set to the second region 132 shown in FIG. 2. Accordingly, the initial program voltage Vpini (e.g., Vpini1) applied to the word lines WL1 to WL4 to program the memory cells MC1 to MC4 may be set higher than the initial program voltage Vpini (e.g., Vpini2) applied to the word lines WL5 and WL6 to program the memory cells MC5 and MC6.

Figure 6:
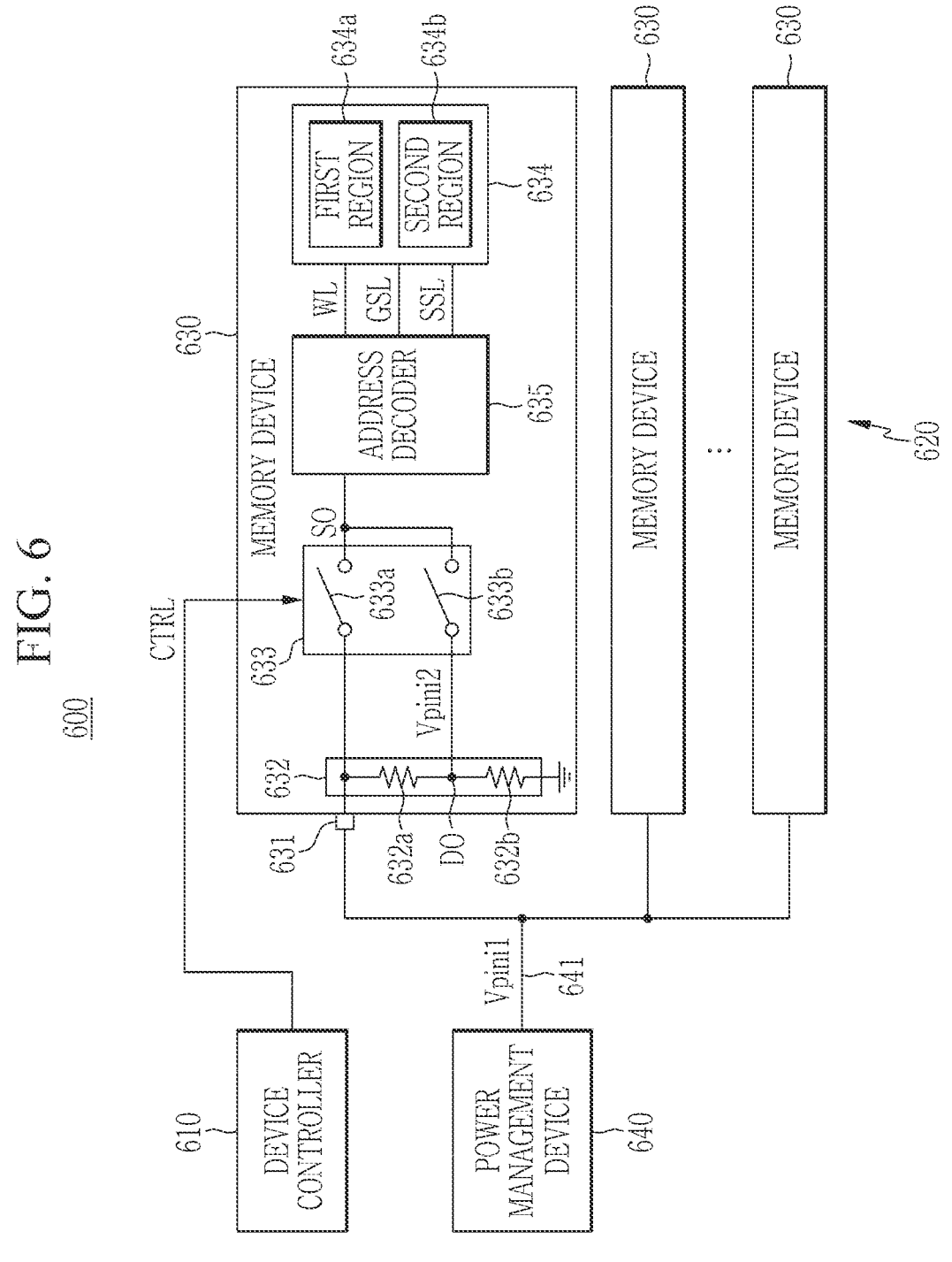
FIG. 6, FIG. 7, FIG. 8, and FIG. 9 are each a diagram illustrating an example of a storage device according to some embodiments.

FIG. 6 is a diagram illustrating an example of a storage device according to some embodiments.

Referring to FIG. 6, a storage device 600 may include a device controller 610, a non-volatile memory 620, and a power management device 640. The non-volatile memory 620 may include a plurality of memory devices 630.

The power management device 640 may supply various voltages to the device controller 610 and/or the non-volatile memory 620. The power management device 640 may receive a voltage supplied from the outside of the storage device 600, generate an internal voltage from the supplied voltage, and convert the internal voltage to generate the various voltages. The various voltages may include an initial program voltage Vpini1. The power management device 640 may supply the initial program voltage Vpini1 to each of the plurality of memory devices 630 through a voltage supply line 641. The power management device 640 may be, for example, a power management integrated circuit (PMIC).

The memory device 630 may include a voltage supply terminal 631, a voltage divider 632, and a switching circuit 633. The voltage supply terminal 631 may be connected to the voltage supply line 641 to receive the initial program voltage Vpini1 from the power management device 640. The voltage divider 632 may divide the initial program voltage Vpini1 to output an initial program voltage Vpini2 that is lower than the initial program voltage Vpini1. The switching circuit 633 may output selectively the initial program voltage Vpini1 from the voltage supply terminal 631 and the initial program voltage Vpini2 from the voltage divider 632.

In some embodiments, the voltage divider 632 may include a plurality of resistors 632a and 632b connected in series, and may output the initial program voltage Vpini2 through a contact point DO of the resistors 632a and 632b. For example, the resistor 632a may be connected between the voltage supply terminal 631 and an output terminal DO of the voltage divider 632, the resistor 632b may be connected between the output terminal DO and a ground terminal, and the initial program voltage Vpini2 may be output from the output terminal DO. In some embodiments, the voltage divider 632 may output two or more initial program voltages Vpini2 having different magnitudes. In this case, the voltage divider 632 may include three or more resistors.

In some embodiments, the switching circuit 633 may include a plurality of switches 633a and 633b. For example, the switch 633a may be connected between the voltage supply terminal 631 and an output terminal SO, and may output the initial program voltage Vpini1 from the voltage supply terminal 631 when turned on. The switch 633b may be connected between the output terminal DO of the voltage divider 632 and the output terminal SO of the switching circuit 633, and may output the initial program voltage Vpini2 from the voltage divider 632 when turned on.

In some embodiments, the memory device 630 may further include a memory cell array 634 and an address decoder 635.

The memory cell array 634 may include a plurality of memory cells. In some embodiments, the memory cell array 634 may include a plurality of cell strings as described with reference to FIG. 4 and FIG. 5, and each cell string may include a plurality of memory cells stacked along a direction perpendicular to a substrate. The memory cell array 634 may further include a plurality of word lines WL connected to the memory cells and a plurality ground selection lines GSL. The memory cell array 634 may further include a plurality of string selection lines SSL.

The memory cell array 634 may be divided into a plurality of regions 634a and 634b. Although FIG. 6 shows two regions 634a and 634b for convenience, the number of regions 634a and 634b is not limited thereto. In some embodiments, the plurality of regions 634a and 634b may be divided based on program time or programming time. For example, when programming data using the same initial program voltage, a program time required to program the data into a certain location of the first region 634a may be longer than a program time required to program the data into a certain location of the second region 634b. In some embodiments, the second region 634b may be located at a higher position than the first region 634b on or from a substrate.

The address decoder 635 may be connected to the memory cell array 634, and may receive an address ADDR and various voltages from the outside. The address decoder 635 may select a word line WL corresponding to a row address of the address ADDR, e.g., a word line WL of memory cells to be programmed from among the word lines WL. The address decoder 635 may select a string selection line SSL and a ground selection line GSL corresponding to the row address from among the string selection lines SSL and the ground selection lines GSL. During programming, the address decoder 635 may apply the initial program voltage Vpini1 or Vpini2 to the selected word line WL, may increase a voltage of the selected word line WL from the initial program voltage Vpini1 or Vpini2 to a target program voltage, and may apply a pass voltage Vpass to the other word lines WL.

The device controller 610 may convert a logical address of data to be programmed into the non-volatile memory 620 into a physical address in response to a write command, and may identify a location to be programmed in the non-volatile memory 620 based on the physical address. The device controller 610 may identify a region where a location for programming the data belongs among the regions 634a and 634b. In some embodiments, the device controller 610 may identify a target memory device 630 into which the data is to be programmed from among the memory devices 630 and a region within the target memory device 630 into which the data is to be programmed. The device controller 610 may transfer a control signal CTRL to the target memory device 630 based on the identified region. The control signal CTRL may include a first control signal and a second control signal. In some embodiments, the first control signal and the second control signal may be different signals. In some other embodiments, the first control signal and the second control signal may be different levels of a control signal. When the location where the data is to be programmed belongs to the first region 634a, the device controller 610 may transfer the first control signal CTRL to the switching circuit 633 so as to allow the switching circuit 633 to output the initial program voltage Vpini1. When the location where the data is to be programmed belongs to the second region 634b, the device controller 610 may transfer the second control signal CTRL to the switching circuit 633 so as to allow the switching circuit 633 to output the initial program voltage Vpini2. In some embodiments, the device controller 610 may transfer the first control signal CTRL for turning on the switch 633a to the switching circuit 633 when the location where the data is to be programmed belongs to the first region 634a, and may transfer the second control signal CTRL for turning on the switch 633b to the switching circuit 633 when the location where the data is to be programmed belongs to the second region 634b. In some embodiments, the switch 633b may be turned off in response to the first control signal CTRL for turning on the switch 633a, and the switch 633a may be turned off in response to the second control signal CTRL for turning on the switch 633b.

According to the above-described embodiments, the storage device 600 may generate the initial program voltages having different sizes, magnitudes, or values based on the initial program voltage Vpini1 output from the power management device 640, and may provide the initial program voltage corresponding to the region where the data is to be programmed. Accordingly, consistent performance of the storage device 600 may be maintained or improved by eliminating variations in program time that may occur depending on a region in which data is to be programmed.

Figure 7:
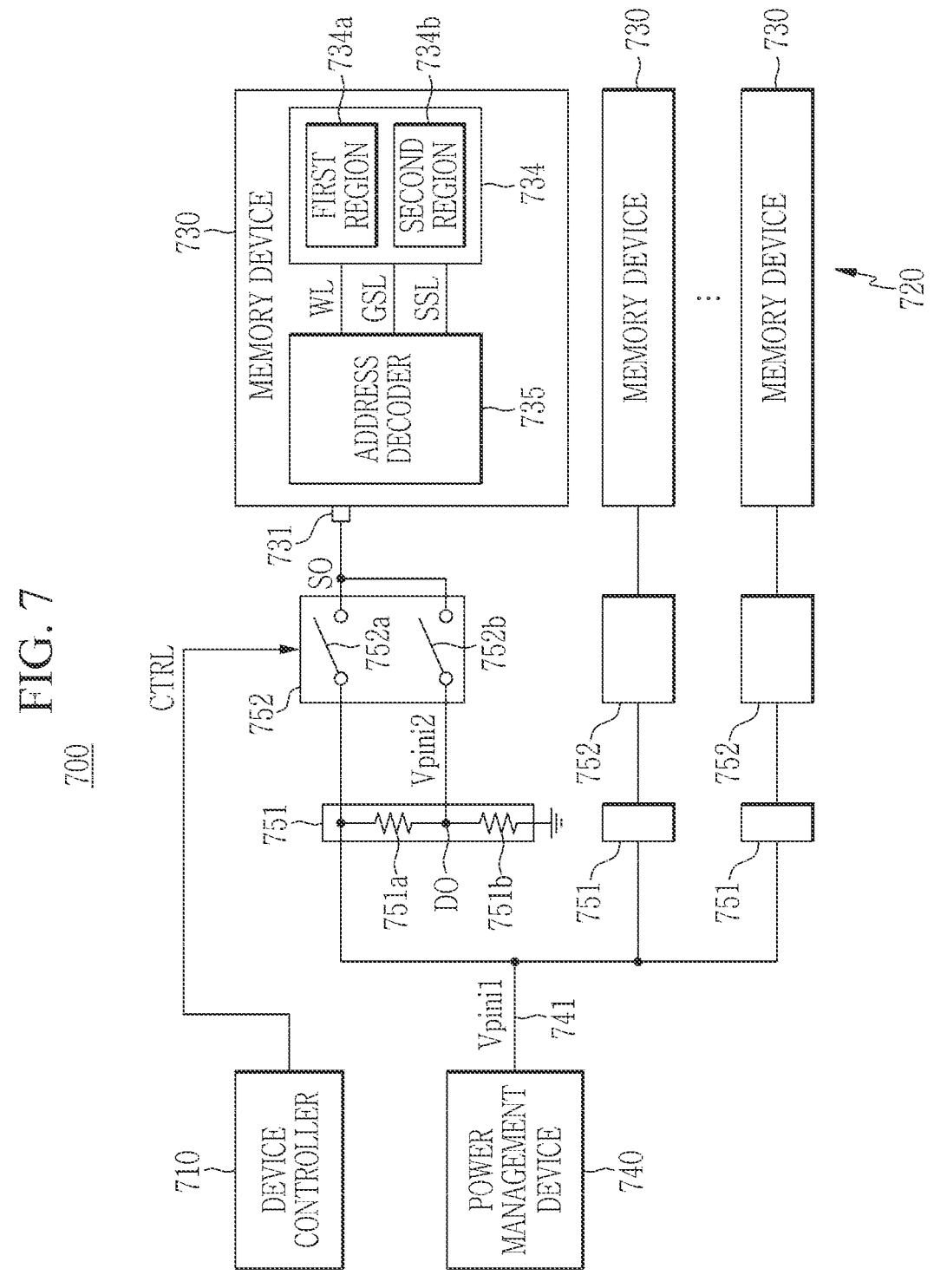

FIG. 7 is a diagram illustrating an example of a storage device according to some embodiments.

Referring to FIG. 7, a storage device 700 may include a device controller 710, a non-volatile memory 720, a power management device 740, a voltage divider circuit 751, and a switching circuit 752. The non-volatile memory 720 may include a plurality of memory devices 730. In the storage device 700, unlike the embodiments described with reference to FIG. 6, the voltage divider circuit 751 and the switching circuit 752 may be formed outside the memory device 730. Descriptions that overlap with those of the storage device 600 shown in FIG. 6 are omitted below.

The power management device 740 may output various voltages including an initial program voltage Vpini1. The voltage divider 751 may be connected to a voltage supply line 741 to receive the initial program voltage Vpini1 from the power management device 740. The voltage divider 751 may divide the initial program voltage Vpini1 to output an initial program voltage Vpini2 lower than the initial program voltage Vpini1. The switching circuit 752 may output selectively the initial program voltage Vpini1 from the voltage supply line 741 and the initial program voltage Vpini2 from the voltage divider 751 through an output terminal SO. The output terminal SO of the switching circuit 752 may be connected to a voltage supply terminal 731 of the memory device 730. In some embodiments, the voltage divider 751 may include a plurality of resistors 751a and 751b connected in series, and may output the initial program voltage Vpini2 through a contact point DO of the resistors 751a and 751b. For example, the resistor 751a may be connected between the voltage supply line 741 and the output terminal DO of the voltage divider 751, the resistor 751b may be connected between the output terminal DO and a ground terminal, and the initial program voltage Vpini2 may be output from the output terminal DO. In some embodiments, the switching circuit 752 may include a plurality of switches 752a and 752b. For example, the switch 752a may be connected between the voltage supply line 741 and the output terminal SO, and may output the initial program voltage Vpini1 from the voltage supply line 741 to the voltage supply terminal 731 of the memory device 730 when turned on. The switch 752b may be connected between the output terminal DO of the voltage divider 751 and the output terminal SO of the switching circuit 752, and may output the initial program voltage Vpini2 from the voltage divider 751 to the voltage supply terminal 731 of the memory device 730 when turned on.

In some embodiments, the memory device 730 may further include a memory cell array 734 and an address decoder 735. The memory cell array 734 may be divided into a plurality of regions 734a and 734b. For example, when programming data using the same initial program voltage, a program time required to program the data into a certain location of the first region 734a may be longer than a program time required to program the data into a certain location of the second region 734b.

The device controller 710 may identify a region where a location for programming the data belongs among the regions 734a and 734b. In some embodiments, the device controller 710 may identify a target memory device 730 that the data is to be programmed into among the memory devices 730 and a region within the target memory device 730 that the data is to be programmed into. The device controller 710 may transfer a control signal CTRL to the switching circuit 752 based on the identified region. The control signal CTRL may include a first control signal and a second control signal. When the location where data is to be programmed belongs to the first region 734a, the device controller 710 may transfer the first control signal CTRL to the switching circuit 752 so as to allow the switching circuit 752 to output the initial program voltage Vpini1. When the location where the data is to be programmed belongs to the second region 734b, the device controller 710 may transfer the second control signal CTRL to the switching circuit 752 so as to allow the switching circuit 752 to output the initial program voltage Vpini2.

According to the above-described embodiments, because the voltage divider 751 may generate the initial program voltages having different sizes, magnitudes, or values based on the initial program voltage Vpini1 output from the power management device 740, the initial program voltage corresponding to the region where the data is to be programmed may be provided. Accordingly, consistent performance of the storage device 700 may be maintained by eliminating variations in program time that may occur depending on regions in which data are to be programmed.

Figure 8:
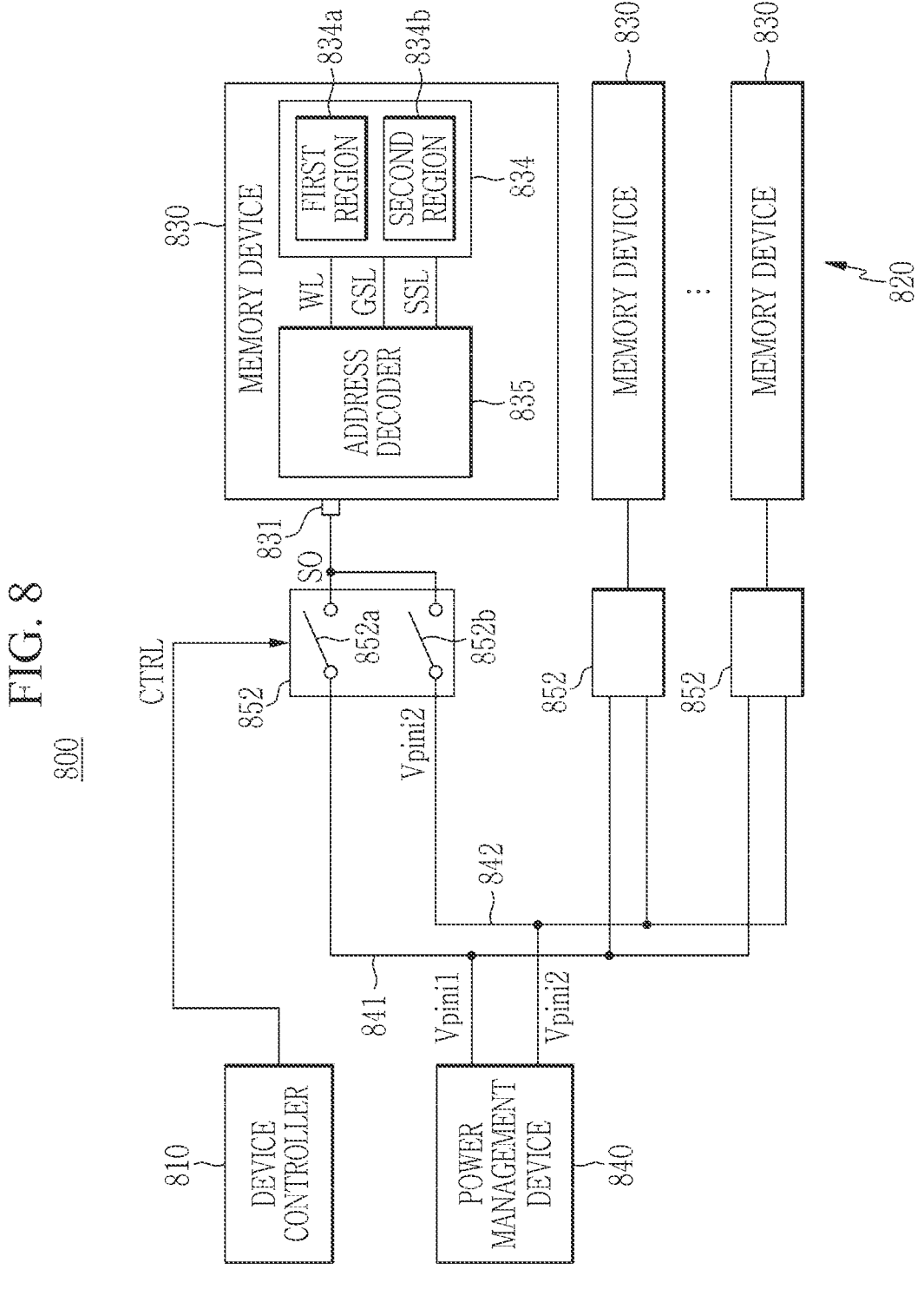

FIG. 8 is a diagram illustrating an example of a storage device according to some embodiments.

Referring to FIG. 8, a storage device 800 may include a device controller 810, a non-volatile memory 820, a power management device 840, and a switching circuit 852. The non-volatile memory 820 may include a plurality of memory devices 830. Descriptions that overlap with those of the storage device 600 or 700 shown in FIG. 6 or FIG. 7 are omitted below.

The power management device 840 may output various voltages including a plurality of initial program voltages Vpini1 and Vpini2 having different sizes, magnitudes, or values. The initial program voltage Vpini1 may be higher than the initial program voltage Vpini2. Although FIG. 8 shows that two initial program voltages Vpini1 and Vpini2 are output, the number of initial program voltages Vpini1 and Vpini2 is not limited thereto.

The switching circuit 852 may be connected to a plurality of voltage supply lines 841 and 842 to receive the initial program voltages Vpini1 and Vpini2 from the power management device 840. That is, the switching circuit 852 may receive the initial program voltage Vpini1 from the power management device 840 through the voltage supply line 841, and may receive the initial program voltage Vpini2 from the power management device 840 through the voltage supply line 842. The switching circuit 852 may output selectively the initial program voltage Vpini1 from the voltage supply line 841 and the initial program voltage Vpini2 from the voltage supply line 842 through an output terminal SO. The output terminal SO of the switching circuit 852 may be connected to a voltage supply terminal 831 of the memory device 830.

In some embodiments, the switching circuit 852 may include a plurality of switches 852a and 852b. For example, the switch 852a may be connected between the voltage supply line 841 and the output terminal SO, and may output the initial program voltage Vpini1 from the voltage supply line 841 to the voltage supply terminal 831 of the memory device 830 when turned on. The switch 852b may be connected between the voltage supply line 842 and the output terminal SO, and may output the initial program voltage Vpini1 from the voltage supply line 842 to the voltage supply terminal 831 of the memory device 830 when turned on.

In some embodiments, the memory device 830 may further include a memory cell array 834 and an address decoder 835. The memory cell array 834 may be divided into a plurality of regions 834a and 834b. For example, when using programming data using the same initial program voltage, a program time required to program the data into a certain location of the first region 834a may be longer than a program time required to program the data into a certain location of the second region 834b.

The device controller 810 may identify a region where a location for programming the data belongs among the regions 834a and 834b. In some embodiments, the device controller 810 may identify a target memory device 830 that the data is to be programmed into among the memory devices 830 and a region within the target memory device 830 that the data is to be programmed into. The device controller 810 may transfer a control signal CTRL to the switching circuit 852 based on the identified region. The control signal CTRL may include a first control signal and a second control signal. When the location where the data is to be programmed belongs to the first region 834a, the device controller 810 may transfer the first control signal CTRL to the switching circuit 852 so as to allow the switching circuit 852 to output the initial program voltage Vpini1. When the location where the data is to be programmed belongs to the second region 834b, the device controller 810 may transfer the second control signal CTRL to the switching circuit 852 so as to allow the switching circuit 852 to output the initial program voltage Vpini2.

According to the above-described embodiments, the initial program voltage corresponding to the region where the data is to be programmed may be selected from among the initial program voltages Vpini1 and Vpini2 output from the power management device 840, and may be provided to the memory device 830. Accordingly, consistent performance of the storage device 800 may be maintained or improved by eliminating variations in program time that may occur depending on regions in which data are to be programmed.

Figure 9:
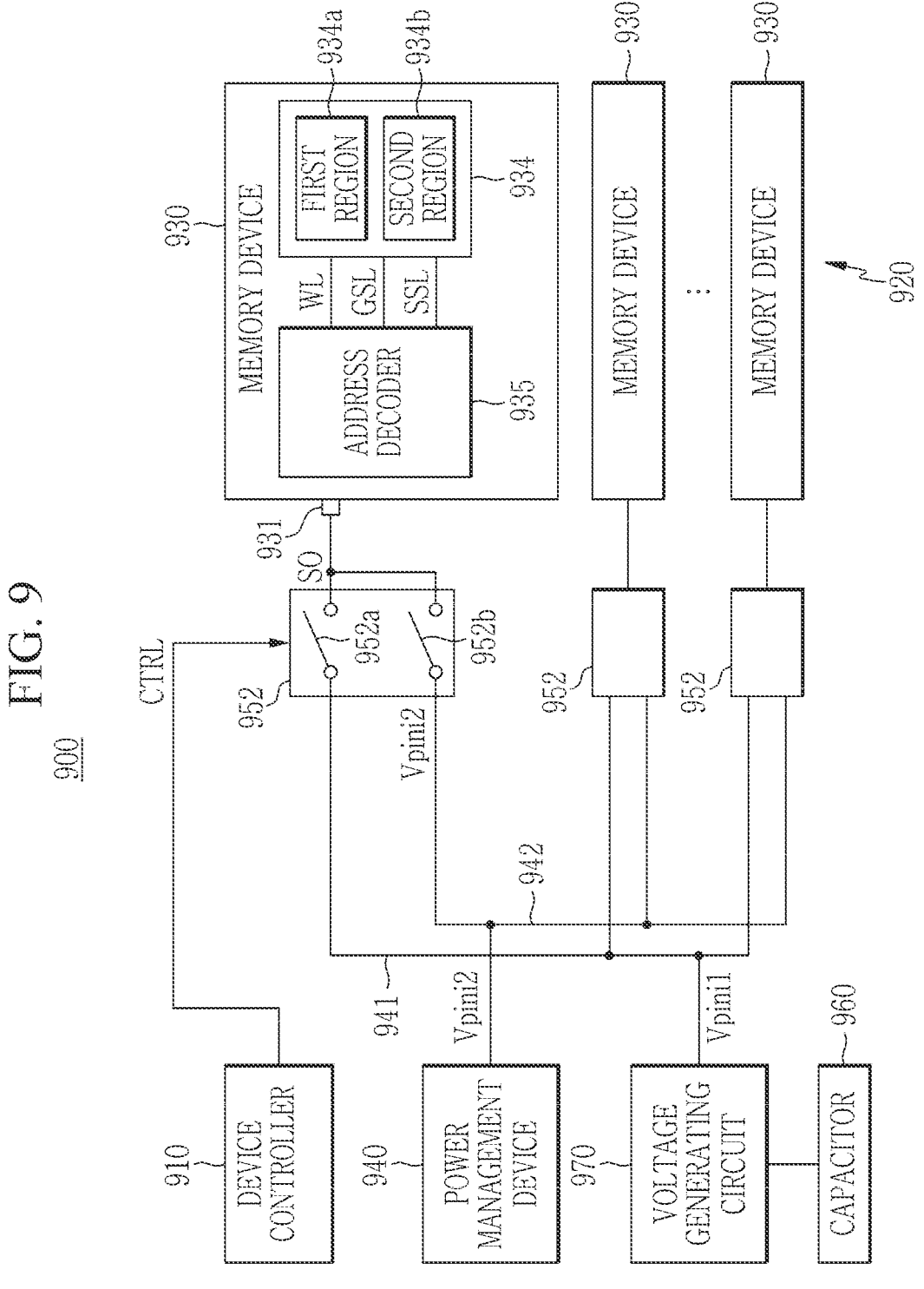

FIG. 9 is a diagram illustrating an example of a storage device according to some embodiments.

Referring to FIG. 9, a storage device 900 may include a device controller 910, a non-volatile memory 920, a power management device 940, a capacitor 960, a voltage generating circuit 970, and a switching circuit 952. The non-volatile memory 920 may include a plurality of memory devices 930. Descriptions that overlap with those of the storage device 600 or 700 shown in FIG. 6 or FIG. 7 are omitted below.

The power management device 940 may output various voltages including an initial program voltage Vpini2.

The capacitor 960 may be charged by power supplied to the storage device 900 or power supplied from the power management device 940. The voltage generating circuit 970 may generate an initial program voltage Vpini1 that is relatively higher than the initial program voltage Vpini2 based on charges stored in the capacitor 960. In some embodiments, the capacitor 960 may be a power loss protection (PLP) capacitor that is charged while the power is supplied to the storage device 900 and is used to provide the charged power to the storage device 900 when the power is off.

The switching circuit 952 may be connected to a voltage supply line 941 to receive the initial program voltage Vpini1 from the voltage generating circuit 970, and may be connected to a voltage supply line 942 to receive the initial program voltage Vpini2 from the power management device 940. The switching circuit 952 may output selectively the initial program voltage Vpini1 from the voltage supply line 941 and the initial program voltage Vpini2 from the voltage supply line 942 through an output terminal SO. The output terminal SO of the switching circuit 952 may be connected to a voltage supply terminal 931 of the memory device 930.

In some embodiments, the switching circuit 952 may include a plurality of switches 952a and 952b. For example, the switch 952a may be connected between the voltage supply line 941 and the output terminal SO, and may output the initial program voltage Vpini1 from the voltage supply line 941 to the voltage supply terminal 931 of the memory device 930 when turned on. The switch 952b may be connected between the voltage supply line 942 and the output terminal SO, and may output the initial program voltage Vpini1 from the voltage supply line 942 to the voltage supply terminal 931 of the memory device 930 when turned on.

In some embodiments, the memory device 930 may further include a memory cell array 934 and an address decoder 935. The memory cell array 934 may be divided into a plurality of regions 934a and 934b. For example, when programming data using the same initial program voltage, a program time required to program the data into a certain location of the first region 934a may be relatively longer than a program time required to program the data into a certain location of the second region 934b.

The device controller 910 may identify a region where a location for programming the data belongs among the regions 934a and 934b. In some embodiments, the device controller 910 may identify a target memory device 930 that the data is to be programmed into among the memory devices 930 and a region within the target memory device 930 that the data is to be programmed into. The device controller 910 may transfer a control signal CTRL to the switching circuit 952 based on the identified region. The control signal CTRL may include a first control signal and a second control signal. When the location where the data is to be programmed belongs to the first region 934a, the device controller 910 may transfer the first control signal CTRL to the switching circuit 952 so as to allow the switching circuit 952 to output the initial program voltage Vpini1. When the location where the data is to be programmed belongs to the second region 934b, the device controller 910 may transfer the second control signal CTRL to the switching circuit 952 so as to allow the switching circuit 952 to output the initial program voltage Vpini2.

In some embodiments, since the capacitor 960 can supply a voltage within a certain period of time because of capacitance of the capacitor 960, the device controller 910 may supply the initial program voltage Vpini1 through the capacitor 960 and the voltage generating circuit 970 under a predetermined condition. The predetermined condition may be, for example, a condition in which performance degradation of the storage device 900 becomes an issue.

Figure 10:
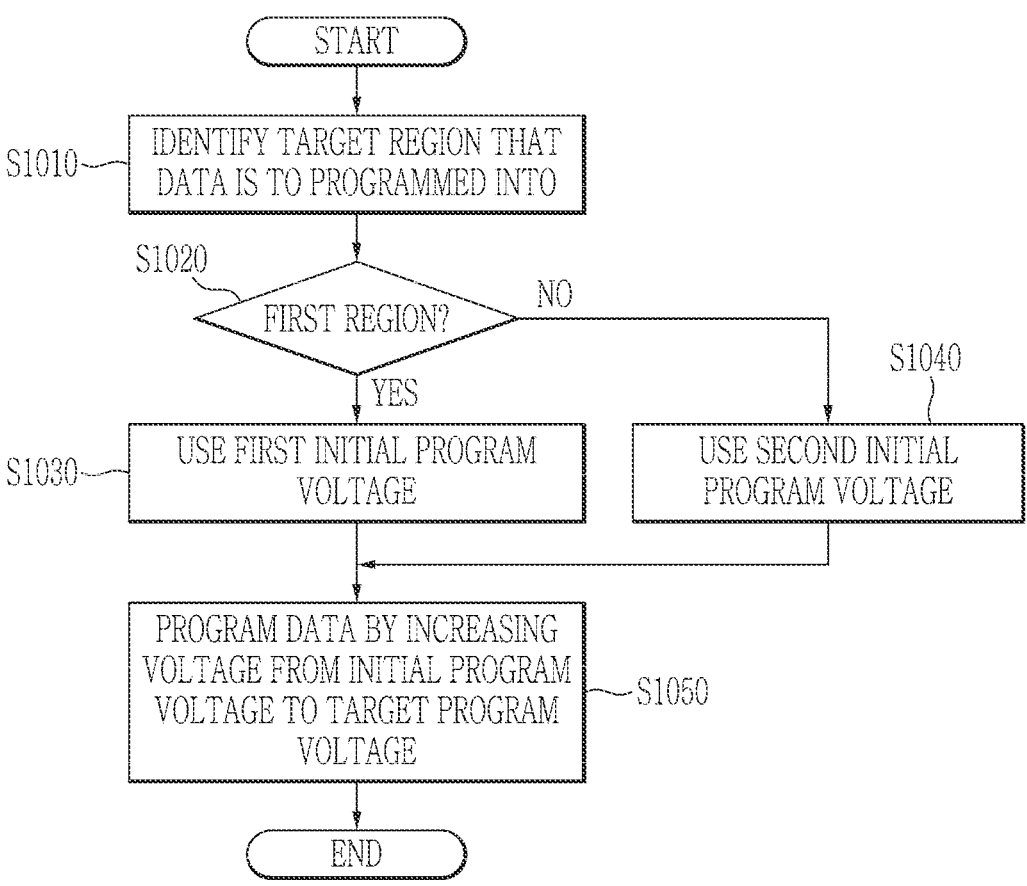
FIG. 10 is a flowchart illustrating an example of an operating method of a storage device according to some embodiments.

FIG. 10 is a flowchart illustrating an example of an operating method of a storage device according to some embodiments.

Referring to FIG. 10, a device controller of a storage device may identify a target region that data is to be programmed into, among a plurality of regions of a memory device at operation S1010. In some embodiments, the device controller may convert a logical address of the data to a physical address and identify the target region based on the physical address at operation S1010.

When the target region belongs to a first region among the regions at operation S1020 ("YES" from operation S1020), the device controller may control the storage device so that the memory device uses a first initial program voltage when programming the data at operation S1030. When the target region belongs to a second region among the regions at operation S1020 ("NO" from operation S1020), the device controller may control the storage device so that the memory device uses a second initial program voltage when programming the data at operation S1040. In some embodiments, the first region may have a longer program time than the second region, and the first initial program voltage may be higher than the second initial program voltage. In some embodiments, a memory cell array of the memory device may have a vertical structure, and the second region may be located at a higher position on a substrate than the first region.

The memory device may program the data by increasing a voltage of a word line from the initial program voltage set by the device controller to a target program voltage at operation S1050.

Figure 11:
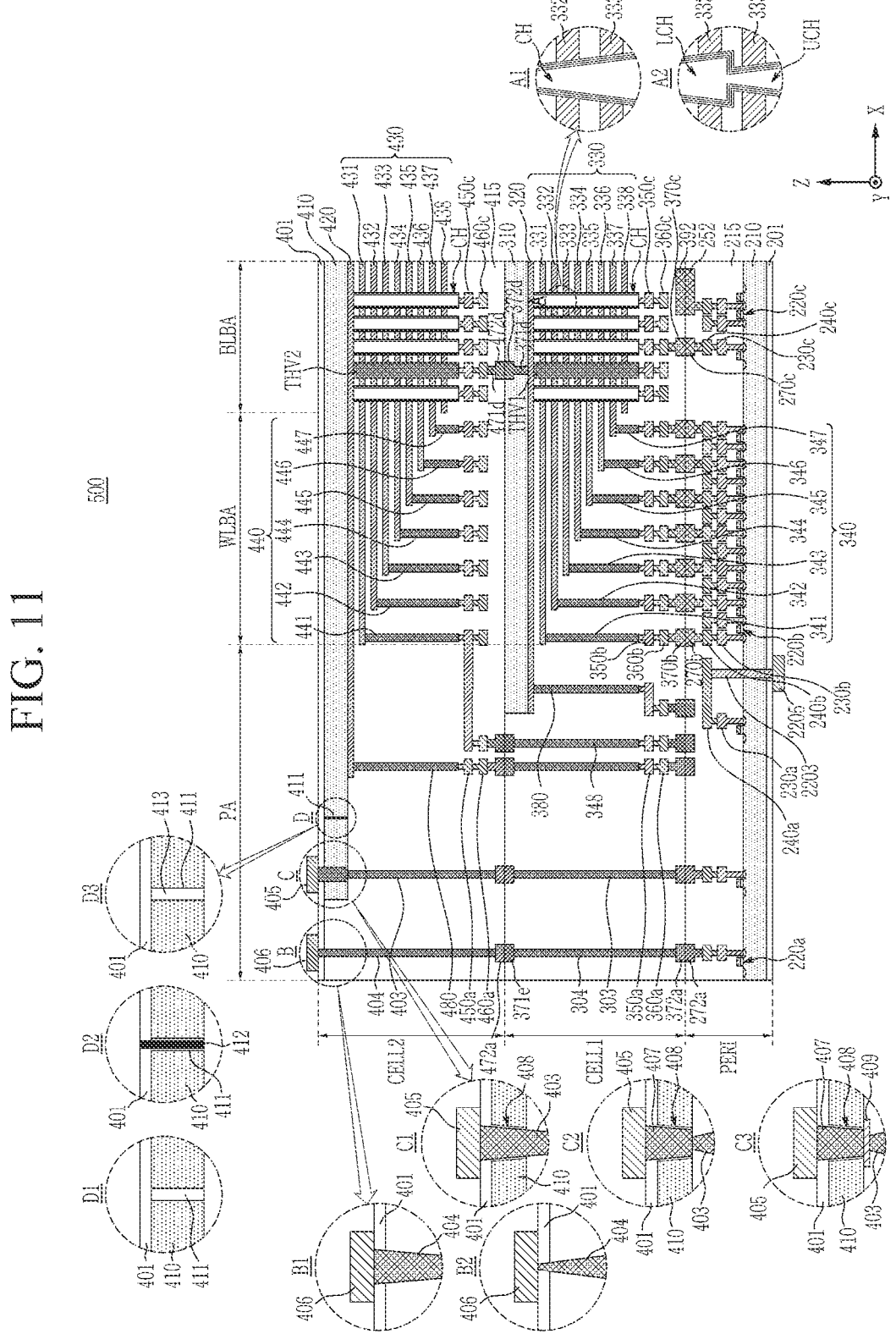
FIG. 11 is a diagram illustrating an example of a memory device according to some embodiments.

FIG. 11 is a diagram illustrating an example of a memory device according to some embodiments.

Referring to FIG. 11, the memory device 500 may have a chip-to-chip (C2C) structure. At least one upper chip including a cell region CELL and a lower chip including a peripheral circuit region PERI may be manufactured separately, and then, the at least one upper chip and the lower chip may be connected to each other by a bonding method to realize the C2C structure. For example, the bonding method may be a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 11, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 11. However, embodiments are not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 210 and a plurality of circuit elements 220a, 220b and 220c formed on the first substrate 210. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220a, 220b and 220c, and second metal lines 240a, 240b and 240c formed on the first metal lines 230a, 230b and 230c. The plurality of metal lines may be formed of at least one of various conductive materials. For example, the first metal lines 230a, 230b and 230c may be formed of tungsten having a relatively high electrical resistivity, and the second metal lines 240a, 240b and 240c may be formed of copper having a relatively low electrical resistivity.

The first metal lines 230a, 230b and 230c and the second metal lines 240a, 240b and 240c are illustrated and described in the present embodiments. However, embodiments are not limited thereto. In certain embodiments, at least one or more additional metal lines may further be formed on the second metal lines 240a, 240b and 240c. In this case, the second metal lines 240a, 240b and 240c may be formed of aluminum, and at least some of the additional metal lines formed on the second metal lines 240a, 240b and 240c may be formed of copper having an electrical resistivity lower than that of aluminum of the second metal lines 240a, 240b and 240c.

The interlayer insulating layer 215 may be on the first substrate 210 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line (not shown) may be on and under the word lines 330, and the plurality of word lines 330 may be between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', a channel structure CH may be provided in the bit line bonding region BLBA and may extend in the direction perpendicular to the top surface of the second substrate 310. The channel structure may penetrate or extend through the word lines 330, the string selection lines, and the ground selection line. The channel structure CH may include a data storage layer, a channel layer, and a filling insulation layer. The channel layer may be electrically connected to a first metal line 350c and a second metal line 360c in the bit line bonding region BLBA. For example, the second metal line 360c may be a bit line and may be connected to the channel structure CH through the first metal line 350c. The bit line 360c may extend in a first direction (e.g., a Y-axis direction) parallel to the top surface of the second substrate 310.

In some embodiments, as illustrated in a region 'A2', a channel structure CH may include a lower channel LCH and an upper channel UCH, which may be connected to each other. For example, the channel structure CH may be formed by a process of forming the lower channel LCH and a process of forming the upper channel UCH. The lower channel LCH may extend in the direction perpendicular to the top surface of the second substrate 310, and may penetrate or extend through the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350c and the second metal line 360c. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH which are formed by the sequentially performed processes.

In the case in which the channel structure CH includes the lower channel LCH and the upper channel UCH as illustrated in the region 'A2', a word line located near to a boundary between the lower channel LCH and the upper channel UCH may be a dummy word line. For example, one or more of the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, in the region 'A2' the number of the lower word lines 331 and 332 through which the lower channel LCH may extend may be less than the number of the upper word lines 333 to 338 through which the upper channel UCH extends. However, embodiments are not limited thereto. In certain embodiments, the number of the lower word lines through which the lower channel LCH may extend may be equal to or more than the number of the upper word lines through which the upper channel UCH may extend. In addition, structural features and relations of connections of the channel structure CH in the second cell region CELL2 may be substantially the same as those of the channel structure CH in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 11, the first through-electrode THV1 may penetrate or extend through the common source line 320 and the plurality of word lines 330. In certain embodiments, the first through-electrode THV1 may further penetrate or extend through the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472d. The first through-metal pattern 372d and the second through-metal pattern 472d may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to a page buffer included in the peripheral circuit region PERI. For example, some of the circuit elements 220c of the peripheral circuit region PERI may be components of the page buffer, and the bit line 360c may be electrically connected to the circuit elements 220c that are components of the page buffer through an upper bonding metal pattern 370c of the first cell region CELL1 and an upper bonding metal pattern 270c of the peripheral circuit region PERI.

Referring continuously to FIG. 11, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (e.g., cell contact plugs 341 to 347). First metal lines 350b and second metal lines 360b may be sequentially connected onto the cell contact plugs 340 connected to the word lines 330. In the word line bonding region WLBA, the cell contact plugs 340 may be connected to the peripheral circuit region PERI through upper bonding metal patterns 370b of the first cell region CELL1 and upper bonding metal patterns 270b of the peripheral circuit region PERI.

The cell contact plugs 340 may be electrically connected to a row decoder included in the peripheral circuit region PERI. For example, some of the circuit elements 220b of the peripheral circuit region PERI may be components of the row decoder, and the cell contact plugs 340 may be electrically connected to the circuit elements 220b that are components of the row decoder through the upper bonding metal patterns 370b of the first cell region CELL1 and the upper bonding metal patterns 270b of the peripheral circuit region PERI. In some embodiments, an operating voltage of the circuit elements 220b that are components of the row decoder may be different from an operating voltage of the circuit elements 220c that are components of the page buffer. For example, the operating voltage of the circuit elements 220c that are components of the page buffer may be greater than the operating voltage of the circuit elements 220b that are components of the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (e.g., cell contact plugs 441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370b may be formed in the first cell region CELL1, and the upper bonding metal patterns 270b may be formed in the peripheral circuit region PERI. The upper bonding metal patterns 370b of the first cell region CELL1 and the upper bonding metal patterns 270b of the peripheral circuit region PERI may be electrically connected to each other by the bonding method. The upper bonding metal patterns 370b and the upper bonding metal patterns 270b may be formed of aluminum, copper, or tungsten.

In the external pad bonding region PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by the bonding method in the external pad bonding region PA. Likewise, an upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by the bonding method.

Common source line contact plugs 380 and 480 may be in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2.

Input/output pads 2205, 405 and 406 may be in the external pad bonding region PA. Referring to FIG. 11, a lower insulating layer 201 may cover a bottom surface of the first substrate 210, and a first input/output pad 2205 may be formed on the lower insulating layer 201. The first input/output pad 2205 may be connected to at least one of a plurality of the circuit elements 220a in the peripheral circuit region PERI through a first input/output contact plug 2203 and may be separated from the first substrate 210 by the lower insulating layer 201. In addition, a side insulating layer (not shown) may be between the first input/output contact plug 2203 and the first substrate 210 and may electrically isolate the first input/output contact plug 2203 from the first substrate 210.

An upper insulating layer 401 covering a top surface of the third substrate 410 may be formed on the third substrate 410. A second input/output pad 405 and/or a third input/output pad 406 may be on the upper insulating layer 401. The second input/output pad 405 may be connected to at least one of the plurality of circuit elements 220a in the peripheral circuit region PERI through second input/output contact plugs 403 and 303, and the third input/output pad 406 may be connected to at least one of the plurality of circuit elements 220a in the peripheral circuit region PERI through third input/output contact plugs 404 and 304.

In some embodiments, the third substrate 410 may not be in a region in which the input/output contact plug is provided. For example, as illustrated in a region 'B', the third input/output contact plug 404 may be separated from the third substrate 410 in a direction that is parallel to the top surface of the third substrate 410, and the third input/output contact plug 404 may penetrate or extend through an interlayer insulating layer 415 of the second cell region CELL2 so as to be connected to the third input/output pad 406. In this case, the third input/output contact plug 404 may be formed by at least one of various processes.

In some embodiments, as illustrated in a region 131', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less or smaller toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In some embodiments, as illustrated in a region 132', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less or smaller toward the upper insulating layer 401. For example, the third input/output contact plug 404 may be formed together with the cell contact plugs 440 before the second cell region CELL2 and the first cell region CELL1 are bonded to each other.

In some embodiments, the second input/output contact plug 403 may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments are not limited thereto, and in some embodiments, the diameter of the second input/output contact plug 403 may become progressively less toward the second input/output pad 405.

In certain embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In some embodiments, as illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371e.

Meanwhile, in some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, embodiments are not limited thereto, and in certain embodiments, the slit 411 may be formed to have a depth ranging from about 60% to about 70% of a thickness of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 in the external pad bonding region PA from the word line bonding region WLBA. Since the insulating material 413 is formed in the slit 411, it is possible to prevent a voltage provided through the second input/output pad 405 from affecting a metal layer on the third substrate 410 in the word line bonding region WLBA.

Meanwhile, in certain embodiments, the first to third input/output pads 2205, 405 and 406 may be selectively formed. For example, the memory device 500 may be realized to include only the first input/output pad 2205 on the first substrate 210, to include only the second input/output pad 405 on the third substrate 410, or to include only the third input/output pad 406 on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

Figure 12:
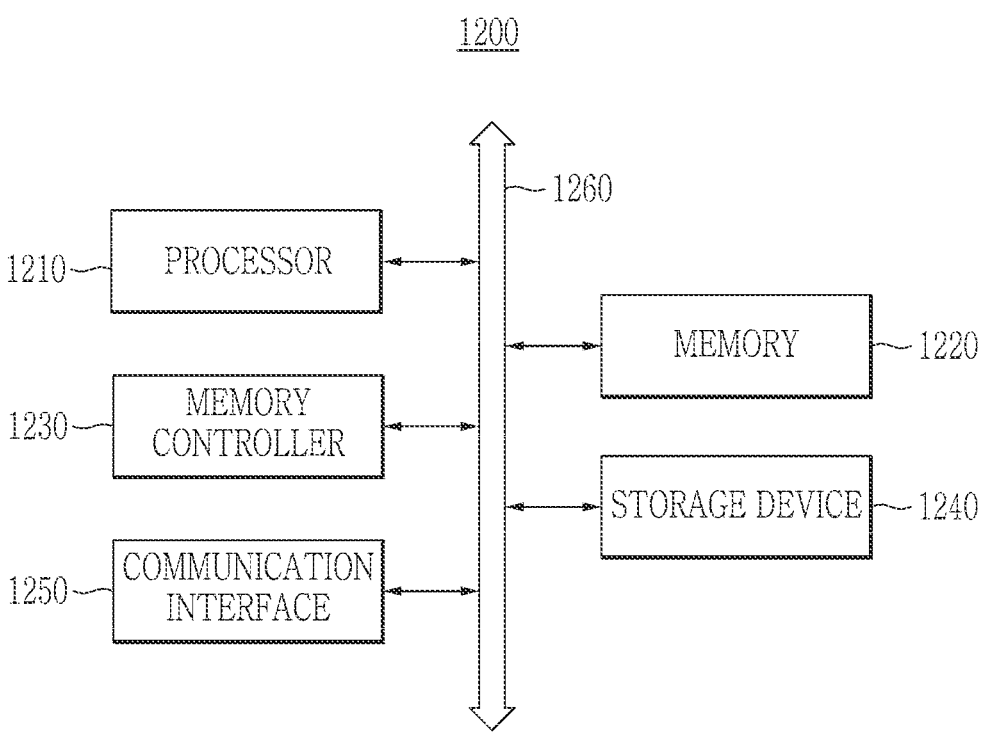
FIG. 12 is a diagram illustrating an example of a computing device according to some embodiments.

FIG. 12 is a diagram illustrating an example of a computing device according to some embodiments.

Referring to FIG. 12, a computing device 1200 may include a processor 1210, a memory 1220, a memory controller 1230, a storage device 1240, a communication interface 1250, and a bus 1260. The computing device 1200 may further include other components.

The processor 1210 may control an overall operation of each component of the computing device 1200. The processor 1210 may be implemented with at least one of various processing units such as a central processing unit (CPU), an application processor (AP), and a graphic processing unit (GPU).

The memory 1220 may store various data and instructions. The memory controller 1230 may control transfers of data or instructions to and from the memory 1220. In some embodiments, the memory controller 1230 may be provided as a separate chip from the processor 1210. In some embodiments, the memory controller 1230 may be provided as an internal component of processor 1210.

The storage device 1240 may non-temporarily store programs and data. In some embodiments, the storage device 1240 may be implemented as the storage device described with reference to FIG. 1 to FIG. 10. The communication interface 1250 may support wired or wireless Internet communication of the computing device 1200. In addition, the communication interface 1250 may support various communication methods other than Internet communication. The bus 1260 may provide a communication function between the components of the computing device 1200. The bus 1260 may include at least one type of bus according to a communication protocol between the components.

In some embodiments, each of the components, elements, modules, or units represented by a block as illustrated in FIG. 1 to FIG. 10 may be implemented as various numbers of hardware, software, and/or firmware structures that execute respective functions described above, according to embodiments. For example, at least one of these components, elements, modules, or units may include various hardware components including a digital circuit, a programmable or non-programmable logic device or array, an application specific integrated circuit (ASIC), or other circuitry using a digital circuit structure, such as a memory, a processor, a logic circuit, a look-up table, etc., that may execute the respective functions through controls of one or more microprocessors or other control apparatuses. Further, at least one of these components, elements, modules, or units may include a module, a program, or a part of code, which contains one or more executable instructions for performing specified logic functions, and executed by one or more microprocessors or other control apparatuses. Furthermore, at least one of these components, elements, modules, or units may further include or may be implemented by a processor such as a central processing unit (CPU) that performs respective functions, a microprocessor, or the like. Functional aspects of embodiments may be implemented in algorithms that execute on one or more processors.

While the inventive concepts have been described in connection with what is presently considered to be practical embodiments, it is to be understood that the inventive concepts are not limited to the disclosed embodiments. On the contrary, it is intended to cover various modifications and equivalent arrangements included within the scope of the appended claims.

What is claimed is:

1. A storage device comprising:
   a memory device comprising a memory cell array comprising a plurality of memory cells and divided into a plurality of regions comprising a first region and a second region; and a device controller configured to control the storage device such that the memory device programs first data into the first region using a first initial program voltage, and programs second data into the second region using a second initial program voltage having a different magnitude from the first initial program voltage,
   wherein the memory cell array has a vertical structure comprising a substrate,
   wherein the second region is located farther from the substrate than the first region is from the substrate,
   wherein the second region comprises a memory cell farthest from the substrate among the plurality of memory cells, and the first region comprises a memory cell closest to the substrate among the plurality of memory cells, and
   wherein the first initial program voltage is higher in magnitude than the second initial program voltage.

2. The storage device of claim 1, wherein the first region has a longer program time than the second region.

3. The storage device of claim 1, further comprising a power management device configured to supply the first initial program voltage through a voltage supply line, and wherein the memory device comprises:
   a voltage divider configured to divide the first initial program voltage supplied from the voltage supply line and output the second initial program voltage, and
   a switching circuit configured to output selectively one of the first initial program voltage and the second initial program voltage.

4. The storage device of claim 3, wherein the device controller is further configured to output a first control signal when the first data is to be programmed into the first region, and output a second control signal when the second data is to be programmed into the second region, and
   wherein the switching circuit is further configured to output the first initial program voltage in response to the first control signal, and output the second initial program voltage in response to the second control signal.

5. The storage device of claim 1, further comprising:
   a power management device configured to supply the first initial program voltage through a voltage supply line;
   a voltage divider configured to divide the first initial program voltage supplied from the voltage supply line and output the second initial program voltage; and
   a switching circuit configured to output selectively one of the first initial program voltage and the second initial program voltage to the memory device.

6. The storage device of claim 1, further comprising:
   a power management device configured to supply the first initial program voltage through a first voltage supply line, and supply the second initial program voltage through a second voltage supply line; and
   a switching circuit configured to output selectively one of the first initial program voltage and the second initial program voltage to the memory device.

7. The storage device of claim 6, wherein the device controller is further configured to output a first control signal when the first data is to be programmed into the first region, and output a second control signal when the second data is to be programmed into the second region, and
   wherein the switching circuit is further configured to output the first initial program voltage in response to the first control signal, and output the second initial program voltage in response to the second control signal.

8. The storage device of claim 1, further comprising a capacitor configured to store charges;

a voltage generating circuit configured to generate the first initial program voltage based on the charges stored in the capacitor, and supply the first initial program voltage through a first voltage supply line;

a power management device configured to supply the second initial program voltage through a second voltage supply line; and a switching circuit configured to output selectively one of the first initial program voltage and the second initial program voltage to the memory device.

9. The storage device of claim 1, wherein the plurality of regions is divided based on program time of respective memory cells in the plurality of regions.

10. A storage device comprising:

a power management device configured to supply a first initial program voltage;

a device controller configured to output a control signal;

a voltage divider configured to divide the first initial program voltage to generate one or more second initial program voltages;

a switching circuit configured to select, in response to the control signal, a selected initial program voltage from among a plurality of initial program voltages comprising the first initial program voltage and the one or more second initial program voltages; and a memory cell array comprising a plurality of memory cells and configured to program data using the selected initial program voltage that is selected by the switching circuit, wherein the memory cell array has a vertical structure comprising a substrate, wherein the memory cell array is divided into a plurality of regions, the plurality of regions comprising a first region and a second region, the second region being located farther from the substrate than the first region is from the substrate, wherein the second region comprises a memory cell farthest from the substrate among the plurality of memory cells, and the first region comprises a memory cell closest to the substrate among the plurality of memory cells, and wherein the first initial program voltage corresponds to the first region, and the second initial program voltage corresponds to the second region, the first initial program voltage being higher in magnitude than the second initial program voltage.

11. The storage device of claim 10, wherein the device controller is further configured to output the control signal such that the switching circuit selects the selected initial program voltage based on a correspondence between the selected initial program voltage and a region into which data is to be programmed.

12. The storage device of claim 11, wherein the second region has a shorter program time than the first region.

13. The storage device of claim 10, wherein the plurality of regions is divided based on program time of respective memory cells in the plurality of regions.

14. A storage device comprising:

a plurality of voltage supply lines configured to transfer respectively a plurality of initial program voltages comprising a first initial program voltage and a second initial program voltage that have different magnitudes;

a device controller configured to output a control signal;

a switching circuit configured to select a selected initial program voltage from among the plurality of initial program voltages transferred through the plurality of voltage supply lines in response to the control signal; and a memory cell array comprising a plurality of memory cells and configured to program data using the initial program voltage selected by the switching circuit, wherein the memory cell array has a vertical structure comprising a substrate, wherein the memory cell array is divided into a plurality of regions, the plurality of regions comprising a first region and a second region, the second region being located farther from the substrate than the first region is from the substrate, wherein the second region comprises a memory cell farthest from the substrate among the plurality of memory cells, and the first region comprises a memory cell closest to the substrate among the plurality of memory cells, and wherein the first initial program voltage corresponds to the first region, and the second initial program voltage corresponds to the second region, the first initial program voltage being higher in magnitude than the second initial program voltage.

15. The storage device of claim 14, further comprising a power management device configured to supply the plurality of initial program voltages through the plurality of voltage supply lines.

16. The storage device of claim 14, further comprising:

a capacitor configured to store charges;

a voltage generating circuit configured to generate the first initial program voltage based on the charges stored in the capacitor, and supply the first initial program voltage through a first voltage supply line among the plurality of voltage supply lines; and a power management device configured to supply the second initial program voltage through a second voltage supply line among the plurality of voltage supply lines.

17. The storage device of claim 14, wherein the device controller is further configured to output the control signal such that the switching circuit selects the selected initial program voltage that corresponds to a region into which the data is to be programmed.

18. The storage device of claim 17, wherein the second region has a shorter program time than the first region.

19. The storage device of claim 14, wherein the plurality of regions is divided based on program time of memory cells in the respective plurality of regions.

* * * * *